United States Patent

Aminzadeh et al.

[11] Patent Number: 5,827,769
[45] Date of Patent: Oct. 27, 1998

[54] METHOD FOR FABRICATING A TRANSISTOR WITH INCREASED HOT CARRIER RESISTANCE BY NITRIDIZING AND ANNEALING THE SIDEWALL OXIDE OF THE GATE ELECTRODE

[75] Inventors: Payman Aminzadeh, Portland; Reza Arghavani, Aloha; Peter Moon, Portland, all of Oreg.

[73] Assignee: Intel Corporation, Santa Clara, Calif.

[21] Appl. No.: 754,219

[22] Filed: Nov. 20, 1996

[51] Int. Cl.$^6$ ............................ H01L 21/336; H01L 21/31
[52] U.S. Cl. ............................................. 438/305; 438/775
[58] Field of Search .................................... 438/300–306, 438/775

[56] References Cited

U.S. PATENT DOCUMENTS

| | | | |
|---|---|---|---|
| 5,403,786 | 4/1995 | Hori | 437/225 |
| 5,436,481 | 7/1995 | Egawa | 437/42 |
| 5,521,127 | 5/1996 | Hori | 437/238 |
| 5,620,910 | 4/1997 | Teramoto | 438/151 |
| 5,637,528 | 6/1997 | Higashitani et al. | 438/452 |
| 5,668,036 | 9/1997 | Sune | 438/253 |

FOREIGN PATENT DOCUMENTS

4337677 A1  11/1995  Germany .

OTHER PUBLICATIONS

Wolf, Stanley "Silicon Processing For the VLSI Era Volume 1: Process Technology", Lattice Press, pp. 198–201, 207–219, 1986.

"Hot–Carrier–Resistant Structure by Re–Oxidized Nitrided Oxide Sidewall for Highly Reliable and High Performance LLD Mosfets," *IEDM 91,* 1991, LSI Laboratory, Mitsubishi Electric Corp.

*Primary Examiner*—John Niebling
*Assistant Examiner*—Michael S. Lebentritt
*Attorney, Agent, or Firm*—Blakely, Sokoloff, Taylor & Zafman

[57] ABSTRACT

A method of fabricating a field effect transistor with increased resistance to hot carrier damage is disclosed. An oxide is grown on the gate electrode. This oxide is strengthened by nitridation and anneal. After a lightly doped drain implant, a second side oxide and a conformal nitride layer are deposited. Then, the conformal nitride is anisotropically etched to form spacers for masking a high dose drain implant. An NMOS transitor fabricated with this process has been found to be forty percent less susceptible to hot carrier damage than a conventional lightly doped drain process. Also, this process has proven to be more manufacturable than one in which the side oxide is nitrided and re-oxidized.

13 Claims, 15 Drawing Sheets

METHOD FOR FABRICATING A TRANSISTOR WITH INCREASED HOT CARRIER RESISTANCE BY NITRIDIZING AND ANNEALING THE SIDEWALL OXIDE OF THE GATE ELECTRODE

FIELD OF THE INVENTION

The present invention relates to the field of semiconductor processing and more particularly to a method of forming field effect transistors.

BACKGROUND OF THE INVENTION

A current process of fabricating an N channel metal-oxide-semiconductor field effect transistor is illustrated in FIGS. 1a through 1g. The process includes steps to create a lightly doped drain region (LDD) that is intended to reduce hot carrier damage to the transistor by reducing the maximum lateral electric field.

FIG. 1a is an illustration of a cross sectional elevation view of P type silicon substrate 101, upon which gate oxide 102 has been grown and gate electrode 103 has been formed. Gate electrode 103 is formed by depositing then patterning a layer of polysilicon on gate oxide 102. FIG. 1b shows the transistor after a step commonly referred to as poly reox, in which oxide film 104 is grown on gate electrode 103. FIG. 1c shows N– tip regions 105 which are formed by a low dose N type ion implant that is masked by gate electrode 103 and oxide film 104. Subsequent thermal processing steps cause N– tip regions 105 to diffuse slightly under the sidewall of gate electrode 103. FIG. 1d shows the transistor after oxide film 106 and conformal nitride film 107 are deposited on the entire structure. FIG. 1e shows the transistor after an anisotropic etch that removes nitride film 107 from everywhere except the sidewall of gate electrode 103. The remaining nitride 108 is commonly referred to as the spacers. FIG. 1f shows N+ source and drain regions 109 which are formed by a high dose ion implant that is blocked by gate electrode 103 and spacers 108. Subsequent thermal processing steps cause N+ source and drain regions 109 to diffuse slightly under spacers 108. FIG. 1g shows the transistor after oxide films 106 and 104 have been removed from the top surface of gate electrode 103, and oxide films 106, 104, and 102 have been removed from the top surfaces of N+ regions 109, in preparation for silicidation. The remainder of oxide films 106 and 104 on the sidewalls of gate electrode 103 is commonly referred to as the side oxide.

Although the LDD has been found to make submicron transistors less susceptible to hot carrier damage, transistor dimensions continue to decrease so hot carrier damage continues to decrease device reliability. One approach to further decrease a transistor's susceptibility to hot carrier damage is to use a re-oxided nitrided oxide (RNO) as the gate oxide. However, with this approach the carrier mobility in the channel is reduced, resulting in a degradation in device performance. In *IEEE IEDM*, Volume 91, pp. 649–652 (1991), Kusunoki et. al. propose the structure of FIG. 2 to improve the hot carrier resistance without degrading performance. Side oxide 201 is an RNO film that not only covers the sidewalls of gate electrode 202, but also replaces gate oxide 203 between LDD region 204 and spacer 205. One disadvantage of this approach is the difficulty in overcoming manufacturability problems in the RNO process. For example, if excessive re-oxidation takes place the thickness of side oxide 201 will increase, causing the lateral dimension of LDD region 204 to increase. The increase in the lateral dimension of LDD region 204 results in an increase in the series resistance of the transistor, which in turn results in decreased drive current and decreased device performance.

Thus, what is desired is a more manufacturable method for fabricating a transistor with increased resistance to hot carrier degradation.

SUMMARY OF THE INVENTION

A novel set of steps in a method of fabricating a field effect transistor is disclosed. First, a gate electrode is formed. Then, an oxide is formed on the sidewalls of the gate electrode. Next, the oxide is nitridized. Finally, the oxide is annealed.

BRIEF DESCRIPTION OF THE DRAWINGS

FIG. 5 is an illustration of a cross sectional perspective view of the structure of FIG. 4a.

DETAILED DESCRIPTION OF A PREFERRED EMBODIMENT

A method of fabricating a field effect transistor is described. In the following description, numerous specific details are set forth in order to provide a thorough understanding of the present invention. It will be obvious, however, to one skilled in the art that the present invention can be practiced without these specific details. In other instances, some details have been omitted in order to avoid obscuring the present invention.

Figure 1A:
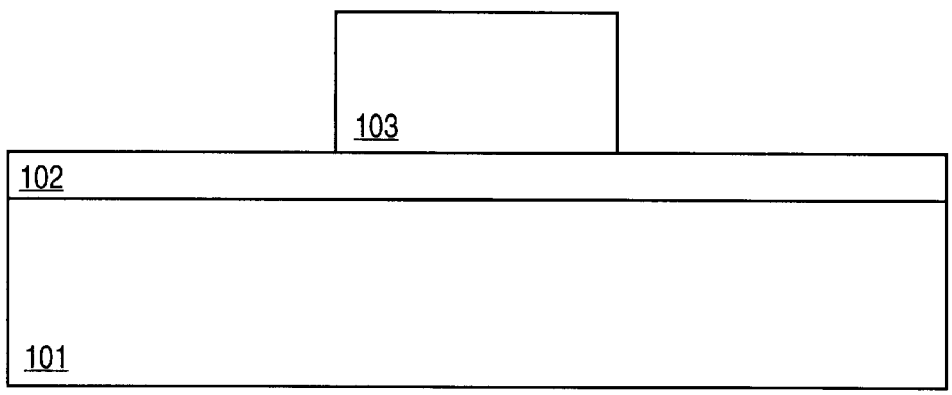
FIG. 1a is an illustration of a cross sectional elevation view of a gate electrode on a silicon substrate.
Figure 1B:
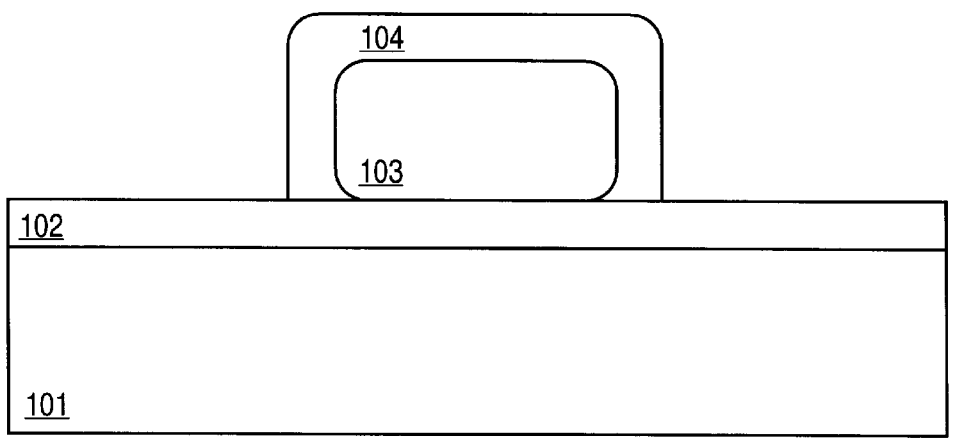
FIG. 1b shows the substrate of FIG. 1a after poly reox.
Figure 1C:
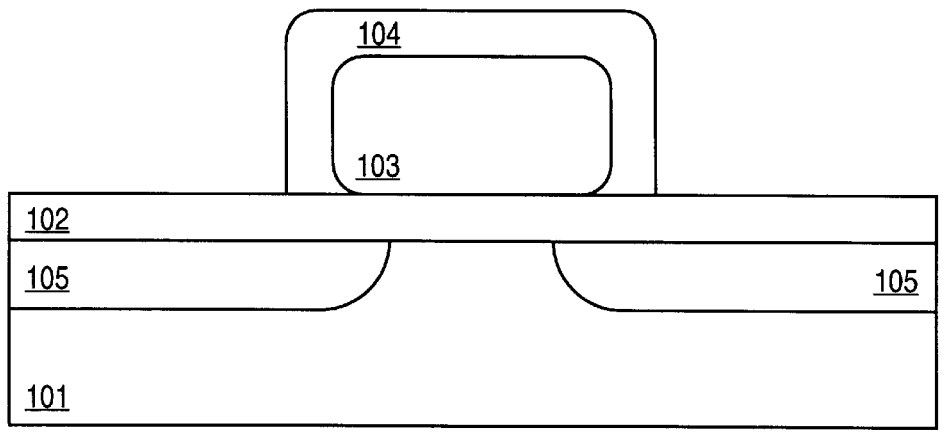
FIG. 1c shows N– tip regions in the substrate of FIG. 1b.
Figure 1D:
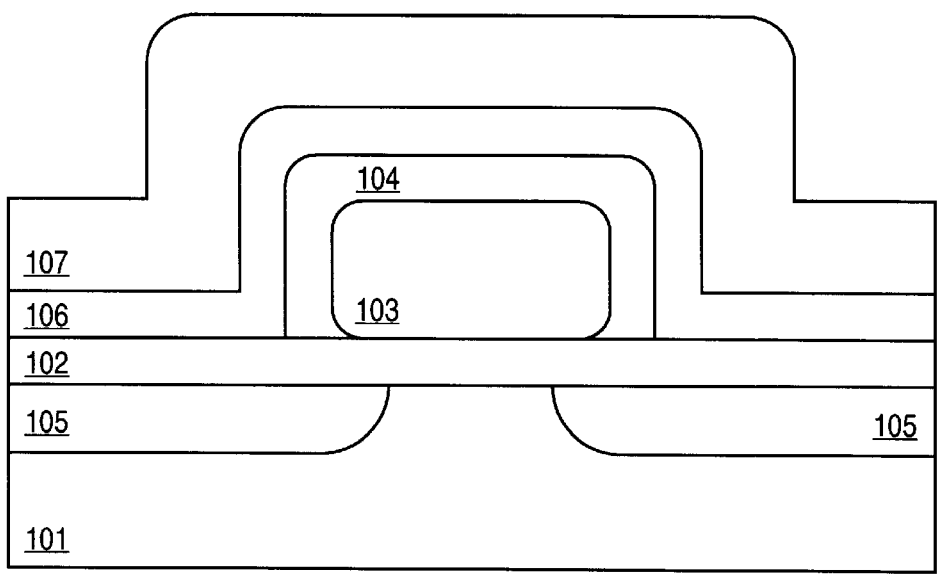
FIG. 1d shows the substrate of FIG. 1c after an oxide film and a conformal nitride film are blanket deposited.
Figure 1E:
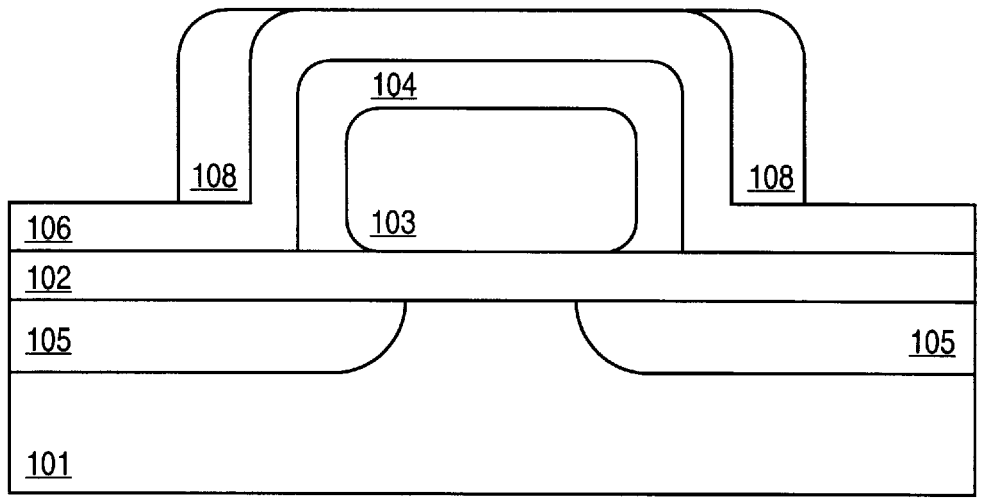
FIG. 1e shows the substrate of FIG. 1d after an anisotropic etch of the conformal nitride film.
Figure 1F:
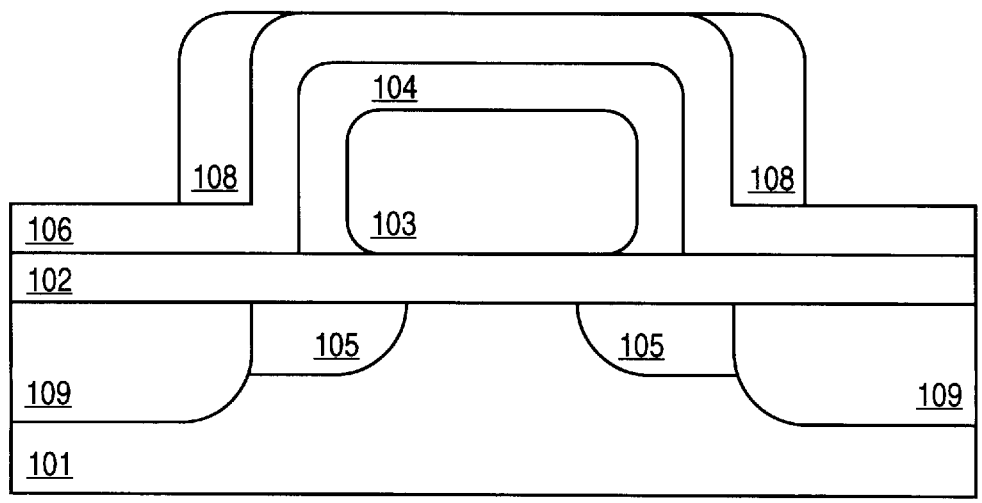
FIG. 1f shows N+ source and drain regions in the substrate of FIG. 1e.
Figure 1G:
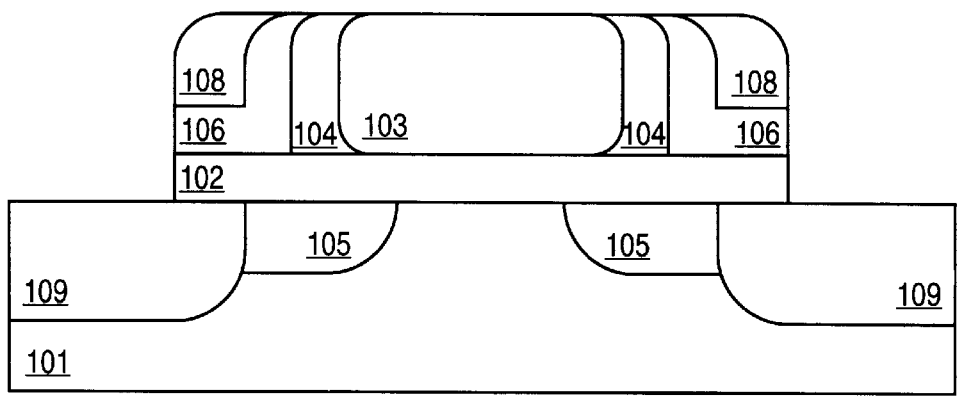
FIG. 1g shows the substrate of FIG. 1e after oxide removal in preparation for silicidation.
Figure 2:
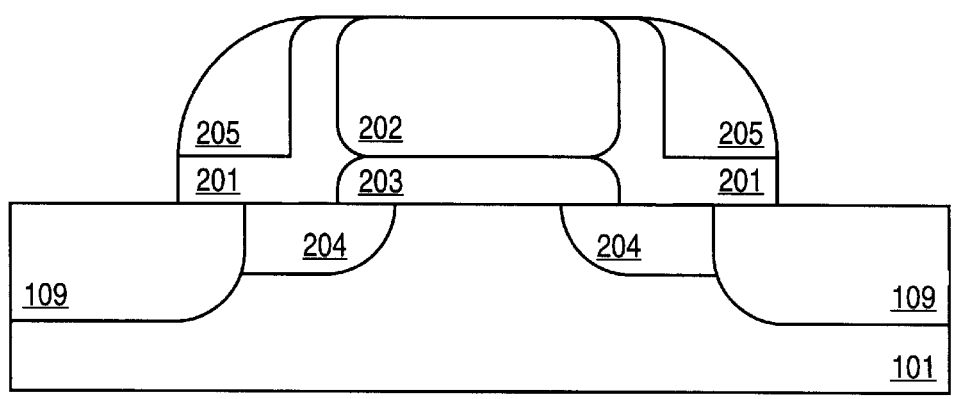
FIG. 2 depicts the transistor of a prior approach to increasing hot carrier resistance without decreasing device performance.
Figure 3:
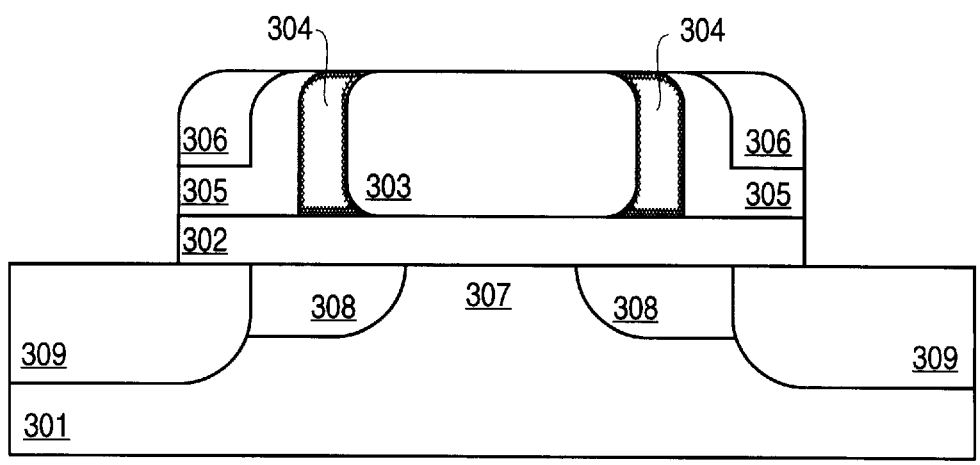
FIG. 3 is an illustration of a cross sectional elevation view of an N channel MOSFET that has been fabricated with an embodiment of the method of the present invention.

FIG. 3 is an illustration of a cross sectional elevation view of an N channel metal-oxide-semiconductor field effect transistor (MOSFET) that has been fabricated with an embodiment of the present invention. The MOSFET is formed on P type well or substrate 301 which is covered with gate oxide 302. Polysilicon gate electrode 303 is formed on top of gate oxide 302 and is flanked by annealed nitrided oxide (ANO) 304, side oxide 305, and spacer 306. Channel region 307 is under gate oxide 302 and gate electrode 303. N− regions 308 flank channel region 307 and are themselves flanked by N+ regions 309. One N-region together with the corresponding N+ region forms the drain of the MOSFET, and the other N− region together with the other N+ region forms the source.

An N channel MOSFET fabricated according to the present invention, as depicted by FIG. 3, has been found to exhibit greater resistance to hot carrier damage than a transistor fabricated according to the process illustrated by FIG. 1a through 1f. Hot carrier damage can be quantified by measuring the degradation of transistor characteristics such as threshhold voltage and drain current after subjecting the transistor to accelerated stress conditions. The degradation in the characteristics of the MOSFET of the present invention under hot carrier stress conditions has been shown to be forty percent less than that of the transistor of FIG. 1f. This improvement is achievable using conventional processing techniques and equipment Any combination of an N or P channel MOSFET on a P or N type substrate or well is possible within the scope of the present invention. FIGS. 4 through 15 illustrate the process of fabricating an N channel MOSFET on a P type silicon substrate or well according to one embodiment of the present invention.

Figure 4:
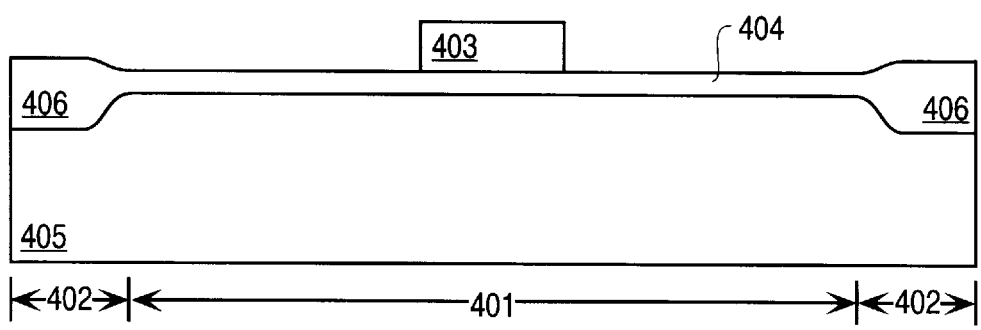
FIG. 4 is an illustration of a cross sectional elevation view of a gate electrode on a silicon substrate.

FIG. 4 is an illustration of a cross sectional elevation view of polysilicon gate electrode 403 above active region 401, in between isolation regions 402, and on gate oxide 404 which is on substrate 405. Well known semiconductor processing methods are used to fabricate the structure of FIG. 4a. Active region 401 and isolation regions 402 are defined by conventional lithography and field oxide 406 is formed by a shallow trench isolation process over isolation regions 402. Gate oxide 404 is a high quality thermally grown oxide with a thickness of less than 200 Angstroms (A). Gate electrode 403 is formed by depositing and patterning a layer of polysilicon. The polysilicon is patterned by conventional lithography and etch processes. Gate oxide 404 is used as an etch stop, therefore gate oxide 404 remains over the entire active region 401. Alternatively, gate oxide 404 can be removed from everywhere except under gate electrode 403.

Figure 5:
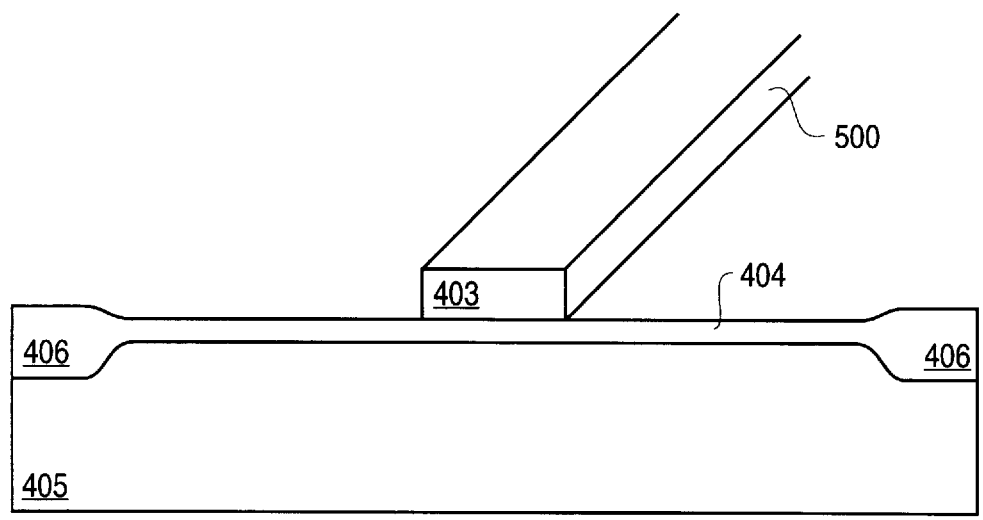

FIG. 5 is an illustration of a cross sectional perspective view of the structure of FIG. 4. Sidewall 500 of gate electrode 403 is formed by the polysilicon etch process. Sidewall 500 approximately defines the drain end of the channel in the transistor of FIG. 3. The maximum lateral electric field occurs at the drain end of the channel, so that is where the greatest control over hot carrier effects can be exerted. Hence, the nitridation and anneal of oxide 304 on the sidewall of the transistor of FIG. 3 is an important feature of the present invention.

Figure 6:
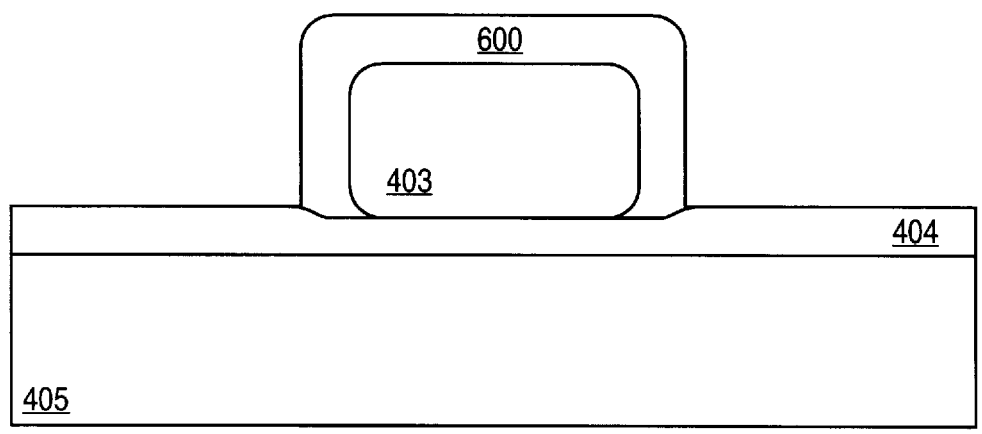
FIG. 6 shows the substrate of FIG. 4 after poly reox.

FIG. 6 is an illustration of a cross sectional elevation view of the structure of FIG. 4 after poly reox. The poly reox step forms oxide 600 on the surface of gate electrode 403, and also increases the thickness of gate oxide 404 over the areas that will become the source and drain regions. In the presently described embodiment of the invention, poly reox is a dry oxidation in the presence of dichloroethylene (DCE, chemical formula $C_2H_2Cl_2$). The oxidation could be performed in dry oxygen or a different chlorine-containing gas, such as anhydrous hydrochloric acid or trichloroethane, or even in a wet environment within the scope of the present invention. A dry DCE oxidation is preferred because it produces a high quality oxide with relatively less corrosive, less ecologically damaging materials. The oxidation time and temperature are high enough to protect the integrity of gate oxide 404 by slightly rounding the corners of gate electrode 403, but not so high as to cause weak overlap of the gate and drain. The time and temperature used for the described embodiment are approximately forty minutes and 900° C., producing an oxide film with a thickness of approximately 200 A. The time and temperature may be varied as desired to produce an oxide film of an alternate thickness, preferably between approximately 100 A and 300 A, within the scope of the present invention.

Oxide 600 is then nitridated to strengthen the oxide. The nitridation results in the incorporation of nitrogen into the silicon dioxide film, forming a nitrided oxide that may be represented by the chemical formula $Si_xO_yN_z$. The chemical structure and composition, including the uniformity of the distribution of nitrogen throughout the film, may vary depending on the nitridation process. In a preferred embodiment, the nitrogen is primarily incorporated into the oxide film in the form of silicon nitride ($Si_3N_4$) at the surface of the oxide film and the interface between the oxide film and the polysilicon, while the bulk of the oxide film remains pure silicon dioxide ($SiO_2$).

The nitridation can be performed in a furnace or a rapid thermal processing (RTP) system. In a preferred embodiment the nitridation is performed in an A. G. Associates 8108 RTP system. One advantage of an RTP system is an increase in wafer to wafer uniformity due to the elimination of furnace position variability. Another advantage is a reduced impact on the process thermal budget due to shorter temperature ramp times.

Figure 7:
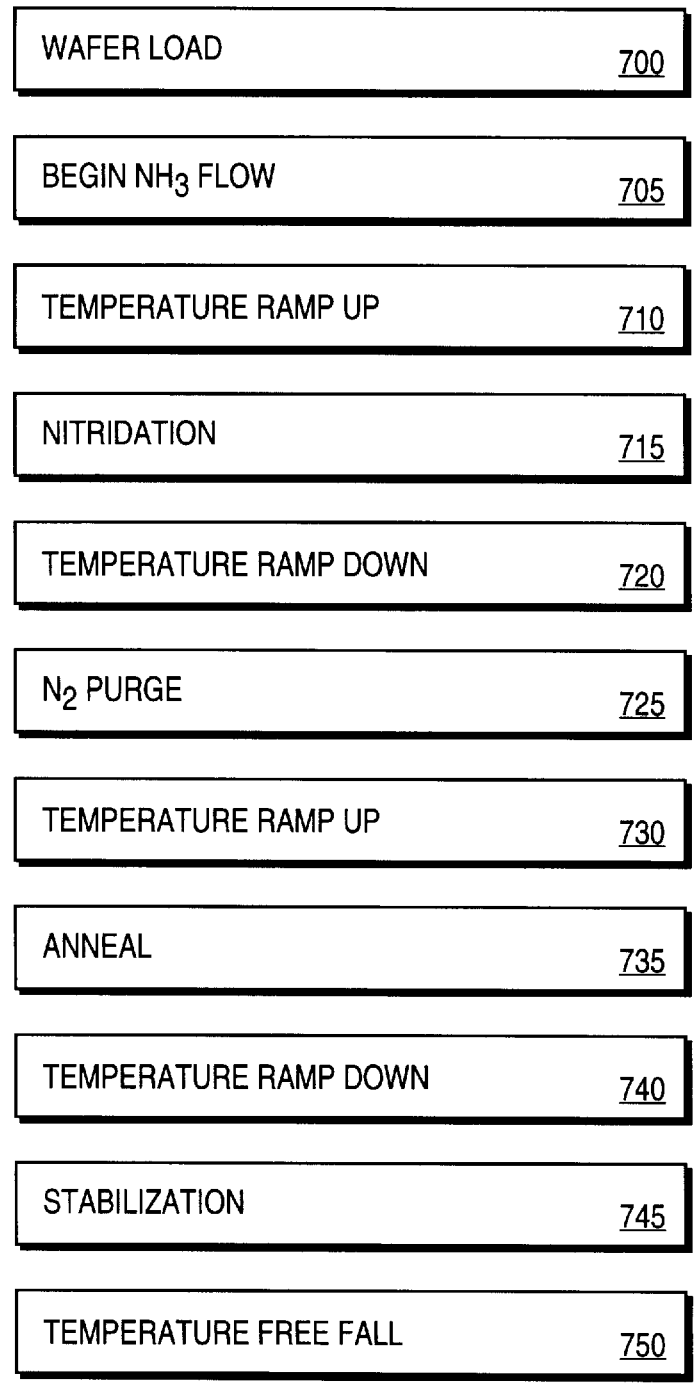
FIG. 7 is a flow chart illustrating the RTP nitridation and anneal operation of an embodiment of the present invention.
Figure 8:
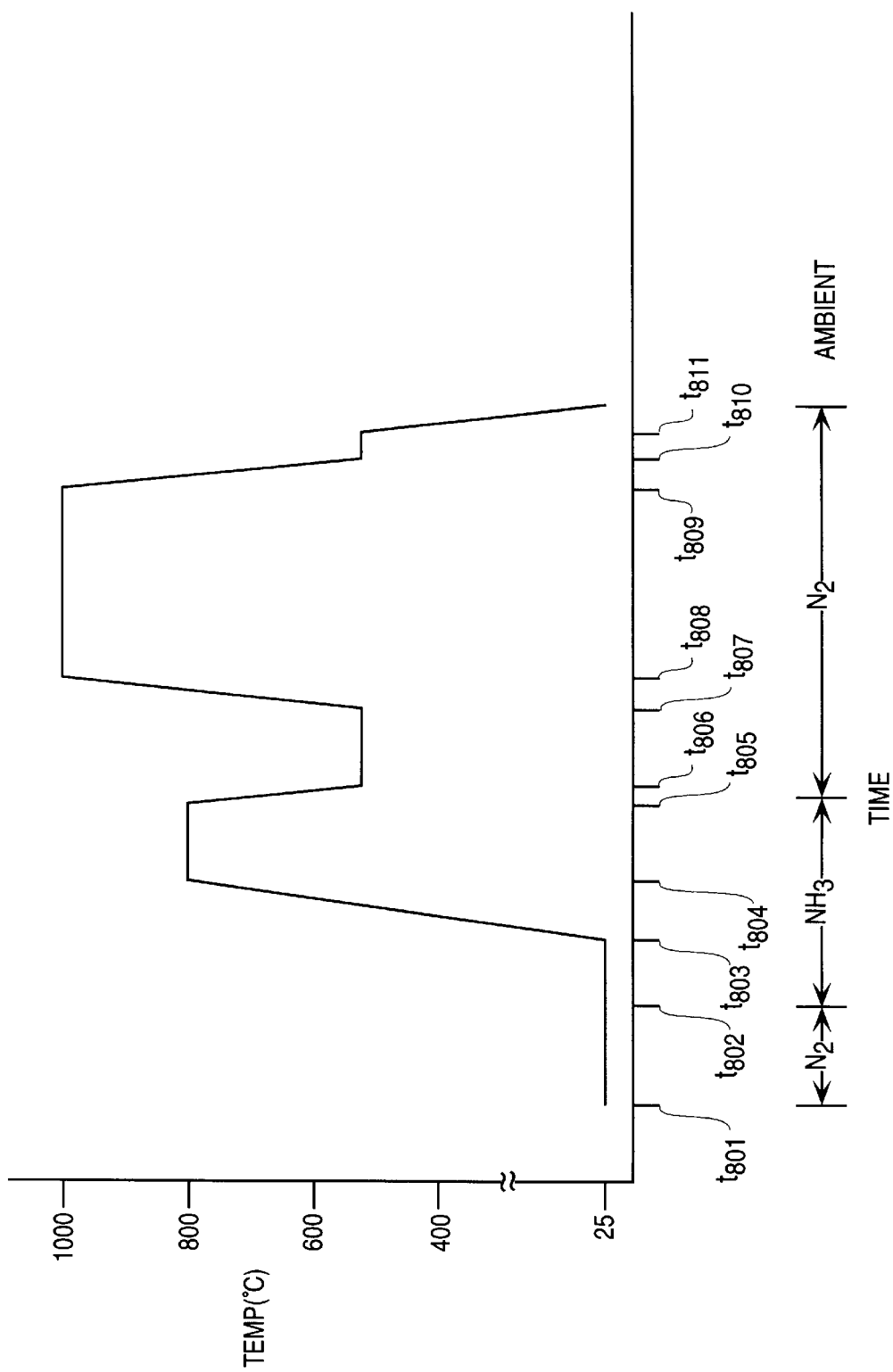
FIG. 8 is a temperature cycle diagram for the operation illustrated by FIG. 5.

The RTP nitridation operation of a preferred embodiment of the present invention is illustrated by the flow chart of FIG. 7 and the temperature cycle diagram of FIG. 8. FIG. 7 shows the sequence of steps in a preferred RTP nitridation. FIG. 8 shows the process temperature versus time for the same RTP operation, as well as the gases flowing at any given time.

Referring now to FIG. 7, in step 700 the wafer upon which the transistors are fabricated is loaded into the RTP system. The wafer load step begins at time $t_{801}$ in FIG. 8, at which time the temperature of the system is approximately 25° C. (room temperature) and pure nitrogen begins to flow at a rate of approximately 20 standard liters per minute (slm). This nitrogen flow is maintained for 30 seconds, or until time $t_{802}$. Then, in step 705, ammonia ($NH_3$) flows at approximately 5 slm for approximately 30 seconds, or until time $t_{803}$. The temperature remains at approximately 25° C. throughout steps 700 and 705.

Next, in step 710, the temperature is ramped up at a rate of approximately 50° C. per second. Ammonia continues to flow at a rate of approximately 5 slm. The time of this step is approximately 17 seconds, from $t_{803}$ to $t_{804}$. Next, in step 715, nitridation is performed at 850° C. During this step, the flow of ammonia continues to be approximately 5 slm. This step, lasting from $t_{804}$ to $t_{805}$, is carried out for a time of approximately 30 seconds. If desired, the nitridation may be performed in other active nitrogen compounds that nitridize the oxide layer. For example, nitrous oxide ($N_2O$) or a combination of nitrous oxide and ammonia can be used.

Figure 9:
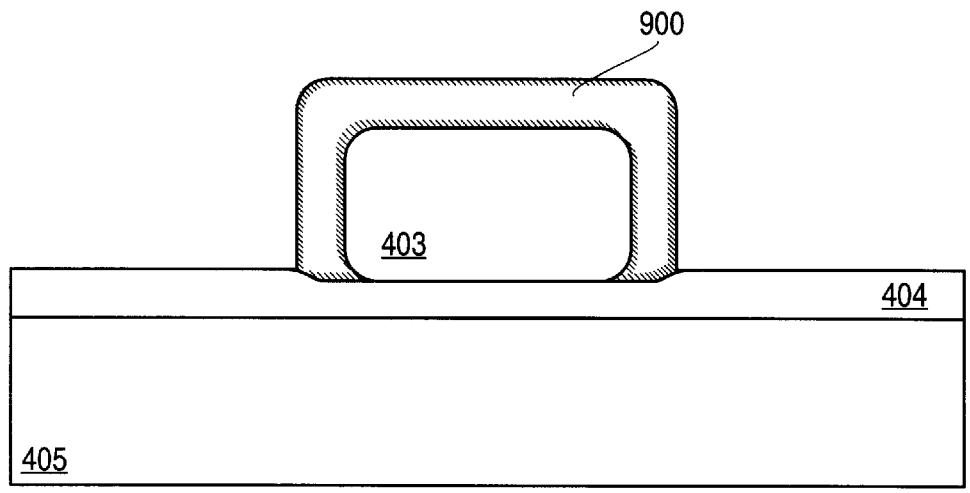
FIG. 9 shows the substrate of FIG. 6 after nitridation.

One desired effect of the nitridation of oxide 600 is to terminate dangling silicon bonds with nitrogen, thereby reducing the number of interface states that can trap hot carriers. Another desired effect is to protect oxide 600 from the incorporation, during subsequent processing, of hydrogen or water, which can create Si—H or Si—OH bonds that are easily broken under hot carrier stress to create trap sites. The nitridation of oxide 600 creates nitrided oxide 900, as illustrated in FIG. 9.

Although the nitridation step protects nitrided oxide 900 from the incorporation of hydrogen or water during subsequent processing, some amount of hydrogen is incorporated during the nitridation step itself. Therefore, a post-nitridation anneal in an inert ambient is performed to drive out hydrogen while densifying nitrided oxide 900. The inert ambient is one in which excess hydrogen at the interface between the silicon and the nitrided silicon dioxide is driven out, but no other change to the chemical composition of the nitrided oxide film, such as re-oxidation, will occur.

The post-nitridation anneal can be performed in a furnace or an RTP system as a separate operation from the nitridation. However, it is preferable to perform both steps in the same operation to increase wafer throughput and to decrease potential for process variability. The RTP nitridation operation of a preferred embodiment of the present invention described above is combined with an RTP anneal operation, as illustrated in the remainder of FIGS. 7 and 8.

Continuing with step 720 of FIG. 7, the temperature is ramped down at a rate of approximately 60° C. per second. During this step, ammonia continues to flow at approximately 5 slm. The ramp down step lasts until a temperature of approximately 500° C. is reached, or approximately 5.8 seconds (from $t_{804}$ to $t_{805}$). Next, in step 725, a nitrogen purge is performed. During this step, the temperature remains at approximately 500° C. and pure nitrogen flows at approximately 20 slm for approximately 30 seconds (from $t_{804}$ to $t_{805}$). The nitrogen purge step has the effect of essentially "quenching" the nitridation reaction, and removing all ammonia from the RTP chamber. In this way, no further reaction occurs in the subsequent anneal step described below.

Next, in step 730, a temperature ramp up at a rate of approximately 50° C. per second is performed, to a temperature of approximately 1050° C. The ramp is performed in pure nitrogen at a flow rate of approximately 5 slm, and takes approximately 11 seconds (from $t_{805}$ to $t_{806}$). Next, in step 735, a nitrogen anneal is performed at a temperature of approximately 1050° C., with the nitrogen flow continuing at approximately 5 slm. This step lasts for approximately 60 seconds (from $t_{806}$ to $t_{807}$). Next, in step 740, the temperature is ramped down at a rate of approximately 65° C. per second, with the nitrogen flow remaining at approximately 5 slm. This step lasts for approximately 7.7 seconds (from $t_{807}$ to $t_{808}$).

Following the temperature ramp down step, the temperature is stabilized in step 745 at approximately 550° C. for 5 seconds (from $t_{808}$ to $t_{809}$), with the nitrogen flow continuing at 5 slm. Finally, in step 750 (from $t_{809}$ to $t_{810}$) no further heating energy is employed and the temperature is allowed to freefall. When the temperature reaches approximately 400° C. the wafer is removed from the chamber and the temperature continues to fall towards room temperature.

The steps of FIG. 7 and the process parameters of FIG. 8 can be varied within the scope of the present invention. For example, the temperatures may be varied. However, it is believed to be important that the nitridation be performed at a relatively low temperature (less than approximately 950° C.) and the anneal be performed at a relatively high temperature (greater than approximately 950° C.). The nitridation temperature must be high enough to ensure adequate nitridation, but not high enough to cause excessive nitridation and stress in the film. The anneal temperature must be high enough to drive out hydrogen, but not high enough to warp the silicon wafer.

The time and ramp rates may be varied as well. Preferably each of the various steps of the RTP process that are performed for a period of time may be performed approximately 5 seconds or greater, and more preferably approximately 10 seconds or greater to promote process stability. Also, each of the steps are preferably performed for a time of 120 seconds or less, and more preferably 90 seconds or less to promote wafer throughput The ramp up and ramp down rates are preferably within approximately +/−50° C. per second and more preferably within approximately +/−25° C. per second of those described earlier. Furthermore, a nitrogen purge, preferably at a lower temperature than the nitridation and anneal, such as step 725 of FIG. 7 is believed helpful in providing controllability to the nitridation process. In general, the purge steps described herein are preferably carried out in pure or essentially pure nitrogen. Alternatively, other inert gases or combinations of inert gases may be used.

Figure 10:
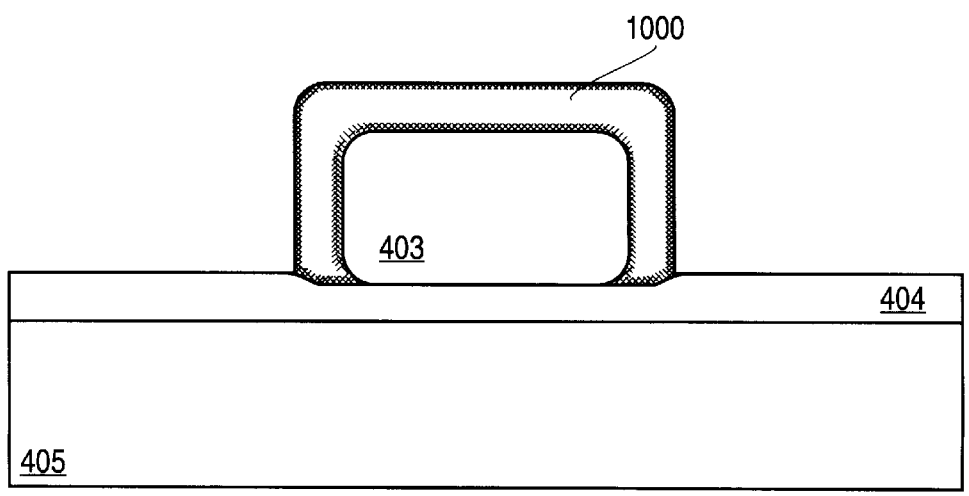
FIG. 10 shows the substrate of FIG. 7 after anneal

The anneal of nitrided oxide 900 creates annealed nitrided oxide (ANO) 1000, as illustrated in FIG. 10. Neither the nitridation nor the anneal add to the film thickness film. Therefore, the process of the current invention is not as likely to exhibit manufacturability problems such as that which can result from a process including a re-oxidation. Under some conditions, such as excessive time or temperature, a re-oxidation can result in an undesired and possibly nonuniform increase in film thickness.

Following the formation of ANO 1000 but before proceeding with the formation of the transistor of FIG. 3, additional process steps may be performed if desired. For example, if the transistor of FIG. 3 is being fabricated within a BiCMOS process, these additional process steps can include lithography, implants, and a polysilicon deposition and etch to form the base and emitter regions of a bipolar transistor. The only effects that these additional process steps have on the structure of FIG. 10 is a possible thinning of oxide 404 over the areas that will become the source and drain regions and a possible thinning of ANO 1000.

Figure 11:
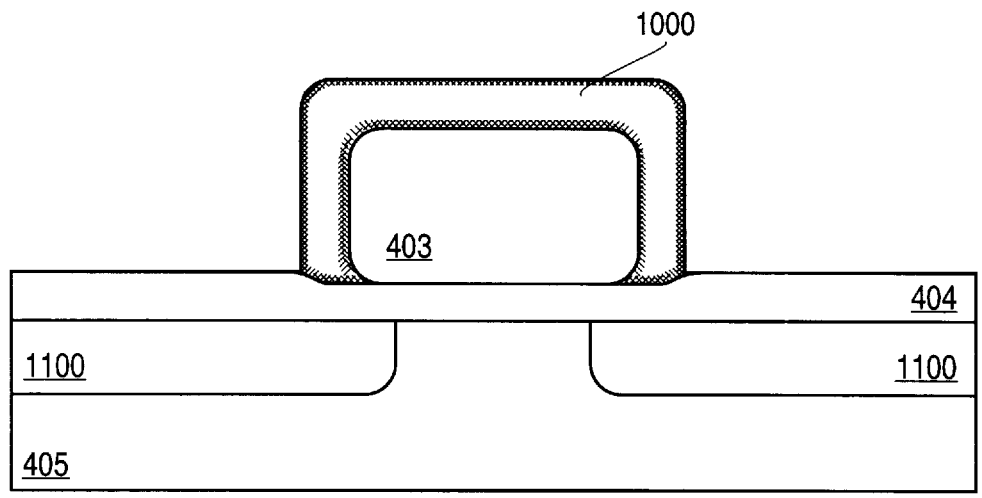
FIG. 11 shows N– tip regions in the substrate of FIG. 10.

After the additional process steps described above, the fabrication of the transistor of FIG. 3 continues with a low dose N– ion implant FIG. 11 is an illustration of a cross sectional elevation view of the substrate of FIG. 10 after N– tip regions 1100 are formed by this implant The implant is masked by gate electrode 403 and ANO 1000 so that the N type ions enter the source and drain regions of the transistor of FIG. 3, but not the channel region. Subsequent thermal processing steps cause the N type ions to diffuse slightly under the sidewall of gate electrode 403. Techniques and dosages for the low dose N type implant and a subsequent anneal, if desired, are well known. Although the low dose N type implant has been described as occurring after formation of ANO 1000, it can also be performed prior to formation of ANO 1000 within the scope of the present invention.

Figure 12:
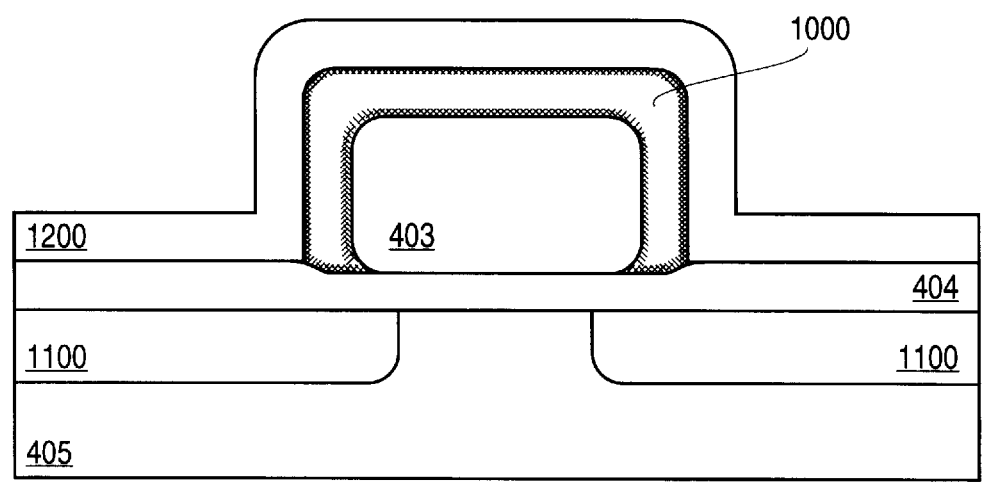
FIG. 12 shows the substrate of FIG. 11 after an oxide film is blanket deposited.

Next, as shown in FIG. 12, oxide layer 1200 is deposited over the entire structure. One purpose of oxide layer 1200 is to increase the total thickness of oxide over the source and drain regions and over the gate electrode, so that this oxide is thick enough to serve as an etch stop for a subsequent silicon nitride etch. This purpose is important if the oxide has been thinned by additional process steps following ANO formation, as described above. However, if desired, oxide layer 1200 could be omitted within the scope of the present invention.

In a preferred embodiment, oxide layer 1200 is silicon dioxide ($SiO_2$) formed by decomposing tetraethyl orthosilicate (TEOS) in a chemical vapor deposition reactor. The reaction of this preferred embodiment takes place at approximately 650° C. for approximately 7 minutes, resulting in oxide layer 1200 with a thickness of approximately 120 A. Other methods of depositing oxide layer 1200 can be used within the scope of the present invention.

Figure 13:
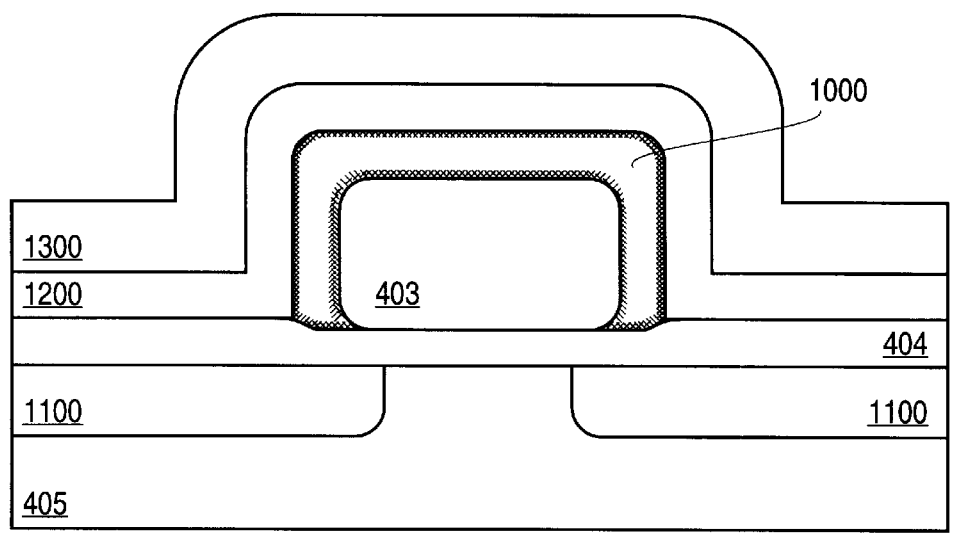
FIG. 13 shows the substrate of FIG. 11 after a spacer layer is blanket deposited.
Figure 14:
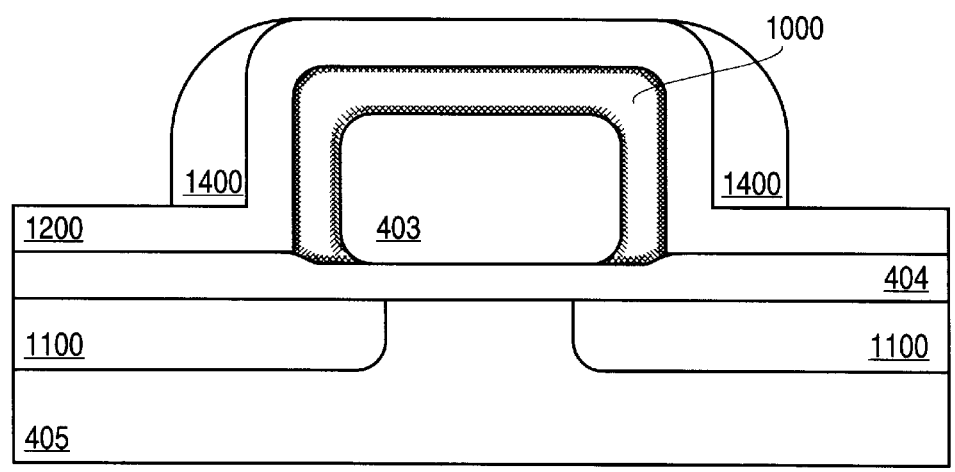
FIG. 14 shows the substrate of FIG. 13 after an anisotropic etch of the spacer film.

After deposition of oxide layer 1200, spacer layer 1300 as shown in FIG. 13 is deposited. Spacer layer 1300 is a conformal layer blanketing the structure of FIG. 12. In a preferred embodiment spacer layer 1300 is silicon nitride ($Si_3N_4$) deposited by chemical vapor deposition at approximately 800° C. A deposition time of approximately 2 hours is preferred, resulting in a layer with a thickness of approximately 1800 A over a flat surface. Alternatively, spacer layer 1300 can be silicon nitride deposited under different conditions, or another insulating material such as silicon dioxide. In any case, spacer layer 1300 is conformal such that it is thicker at the sidewalls of gate electrode 403. Consequently, a subsequent anisotropic etch can be used to clear all of spacer layer 1300 in the flat areas while leaving spacers 1400 at the sidewalls of gate electrode 403, as shown in FIG. 14. The lateral dimension of spacers 1400 is a primary factor in determining the lateral dimension of the LDD region. The thickness of gate electrode 403, the thickness of spacer layer 1300, and the spacer etch step determine the lateral dimension of spacers 1400. Any of these three factors can be varied within the scope of the present invention. Techniques for the anisotropic etch of spacer layer 1300 are well known.

Figure 15:
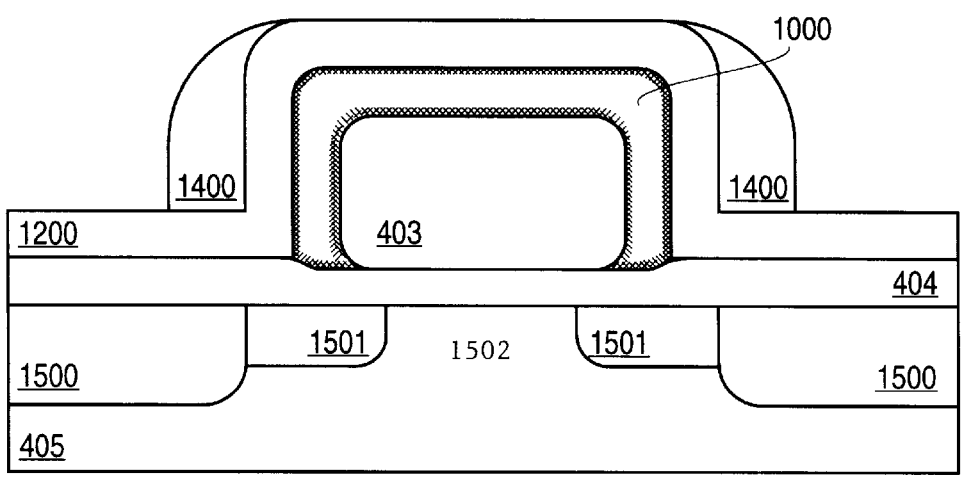
FIG. 15 shows N+ source and drain regions in the substrate of FIG. 14.

Following spacer etch, N+ source and drain regions 1500 as shown in FIG. 15 are formed by a high dose N type ion implant The high dose implant is masked by gate electrode 403, ANO 1000, oxide layer 1200, and spacers 1400, such that lightly doped tip regions 1501 remain between channel region 1502 and N+ regions 1500. Techniques and dosages for the high dose N type implant and a subsequent anneal, if desired, are well known.

The transistor of FIG. 3 is then formed from the structure of FIG. 15 by removing oxide layer 1200 and ANO 1000 from the top surface of gate electrode 403 and by removing oxide layer 1200, ANO 1000, and gate oxide 404 from the top surfaces of N+ regions 1500 that are not covered by spacers 1400. This oxide removal step is performed in the preferred embodiment to prepare for silicidation of the gate electrode and the source and drain regions, but if desired, can be omitted within the scope of the present invention. Appropriate techniques for the oxide removal step are well known.

After oxide removal, spacer 306, side oxide 305 and ANO 304 remain on the sidewall of gate electrode 303, as shown in FIG. 3. Next, if desired, a silicide can be formed on the surfaces of the gate electrode and the source and drain. Although silicide formation can be omitted within the scope of the present invention, its purpose is to reduce contact and sheet resistances of the gate electrode and source and drain areas. Finally, any number of layers of dielectric and interconnects can be formed above the transistor of FIG. 3 to integrate the transistor into a circuit Techniques for silicidation, dielectric formation, and interconnect formation are well known and can be varied broadly without departing from the scope of the present invention.

Thus, a method for fabricating a transistor with increased hot carrier resistance has been described.

What is claimed is:

1. A method of fabricating a field effect transistor comprising the steps of:

forming a gate electrode;

forming a first oxide on the sidewalls of said gate electrode;

nitridating said first oxide to create a nitrided oxide;

annealing said nitrided oxide to create an annealed nitrided oxides;

forming a second oxide adjacent to said annealed nitrided oxide;

forming a conformal layer over said gate electrode, said annealed nitrided oxide, and said second oxide; and anisotropically etching said conformal layer to create spacers for masking a lightly doped drain region from a high dose drain implant.

2. The method of claim 1 wherein said first oxide is formed by dry oxidation.

3. The method of claim 1 wherein said first oxide is formed by dry oxidation with dichloroethylene.

4. The method of claim 1 wherein said nitrided oxide is annealed in an inert ambient.

5. The method of claim 1 wherein said nitrided oxide is annealed in a nitrogen ambient.

6. The method of claim 1 wherein said nitrided oxide is annealed with a rapid thermal process.

7. The method of claim 1 wherein said second oxide is formed by decomposing tetraethyl orthosilicate.

8. A method of fabricating a field effect transistor comprising the steps of:

forming a gate electrode over an insulating layer;

forming a first oxide on the sidewalls of said gate electrode by dry oxidation;

nitridating said first oxide in an ambient comprising ammonia with a rapid thermal process to create a nitrided oxide;

annealing said nitrided oxide in a nitrogen ambient with a rapid thermal process to create an annealed nitrided oxide;

forming a second oxide adjacent to said annealed nitrided oxide;

forming a conformal layer comprising silicon nitride over said gate electrode and said annealed nitrided oxide; and anisotropically etching said conformal layer to create spacers for masking a lightly doped drain region from a high dose drain implant.

9. The method of claim 8 wherein said first oxide is nitridated at approximately 850 degrees Celsius for approximately thirty seconds.

10. The method of claim 8 wherein said nitrided oxide is annealed at approximately 1050 degrees for approximately sixty seconds.

11. A method of fabricating a field effect transistor comprising the steps of:

forming an insulating layer over a substrate of a first conductivity type;

forming a gate electrode over said insulating layer;

forming a first oxide on the sidewalls of said gate electrode by dry oxidation;

nitridating said first oxide in an ambient comprising ammonia with a rapid thermal process to create a nitrided oxide;

annealing said nitrided oxide in a nitrogen ambient with a rapid thermal process to create an annealed nitrided oxide;

implanting a tip region with a first dose of dopant of a second conductivity type;

forming a second oxide adjacent to said annealed nitrided oxide by decomposing tetraethyl orthosilicate;

forming a conformal layer comprising silicon nitride over said gate electrode, said annealed nitrided oxide, and said second oxide; and anisotropically etching said conformal layer to create spacers for masking at least a portion of said tip region from a subsequent implant of a second dose of dopant of the second conductivity type, said second dose being greater than said first dose.

12. The method of claim 11 wherein the step of implanting a tip region with a first dose of dopant of a second conductivity type is performed prior to the step of forming a first oxide on the sidewalls of said gate electrode by dry oxidation.

13. The method of claim 1 wherein said conformal layer comprises silicon nitride.

* * * * *

UNITED STATES PATENT AND TRADEMARK OFFICE
CERTIFICATE OF CORRECTION

PATENT NO. : 5,827,769
DATED : October 27, 1998
INVENTOR(S) : Aminzadeh et al.

It is certified that error appears in the above-identified patent and that said Letters Patent is hereby corrected as shown below:

<u>Column 8,</u>
Line 16, delete "oxides" and insert -- oxide --.

Signed and Sealed this

Tenth Day of June, 2003

JAMES E. ROGAN
*Director of the United States Patent and Trademark Office*